United States Patent
Cho

(10) Patent No.: US 7,319,631 B2
(45) Date of Patent: Jan. 15, 2008

(54) SEMICONDUCTOR MEMORY DEVICE WITH A STACKED-BANK ARCHITECTURE AND METHOD FOR DRIVING WORD LINES OF THE SAME

(75) Inventor: Young-Chul Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/233,700

(22) Filed: Sep. 23, 2005

(65) Prior Publication Data

US 2006/0062072 A1    Mar. 23, 2006

(30) Foreign Application Priority Data

Sep. 23, 2004    (KR) ...................... 10-2004-0076556

(51) Int. Cl.
*G11C 8/00*    (2006.01)
(52) U.S. Cl. .............................. 365/230.03; 365/230.06
(58) Field of Classification Search ............ 365/230.03
See application file for complete search history.

(56) References Cited

U.S. PATENT DOCUMENTS

| | | | | |
|---|---|---|---|---|
| 5,702,984 | A * | 12/1997 | Bertin et al. .................. | 438/15 |
| 6,075,747 | A * | 6/2000 | Won ....................... | 365/230.06 |
| 6,078,542 | A | 6/2000 | Tomishima ............ | 365/230.03 |
| 6,603,683 | B2 * | 8/2003 | Hsu et al. .............. | 365/189.04 |
| 2002/0191707 | A1 * | 12/2002 | Lee ............................ | 375/295 |

FOREIGN PATENT DOCUMENTS

| | | |
|---|---|---|
| JP | 2003-007062 | 1/2003 |
| KR | 2000-0018314 | 4/2000 |

* cited by examiner

*Primary Examiner*—Amir Zarabian
*Assistant Examiner*—Jason Lappas
(74) *Attorney, Agent, or Firm*—F. Chau & Assoc., LLC

(57) ABSTRACT

A semiconductor memory device having a stacked-bank architecture capable of activating the word lines coupled to memory cells selectively with respect to the memory banks is disclosed. The semiconductor memory device includes memory bank groups and a decoder unit. Each of the memory bank groups includes a plurality of memory banks arranged in a stacked-bank architecture. The decoder unit generates a decoded row address signal to individually select one of the memory banks in response to an external address signal under the control of an output enable signal. Accordingly, the semiconductor memory device having a stacked-bank architecture capable of activating the word lines coupled to memory cells selectively with respect to the memory banks has lower power consumption and operates stably against noise.

22 Claims, 16 Drawing Sheets

SEMICONDUCTOR MEMORY DEVICE WITH A STACKED-BANK ARCHITECTURE AND METHOD FOR DRIVING WORD LINES OF THE SAME

CROSS-REFERENCE TO RELATED APPLICATIONS

This application claims priority to Korean Patent Application No. 2004-76556, filed on Sep. 23, 2004, the contents of which are herein incorporated by reference in its entirety.

BACKGROUND OF THE INVENTION

1. Field of the Invention

The present invention relates to a semiconductor memory device, and particularly to a semiconductor memory device with a stacked-bank architecture that enables decoded row address signals with respect to each of a plurality of banks, and activates word lines coupled to memory cells with respect to each of the plurality of banks.

2. Description of the Related Art

A semiconductor memory device such as a DRAM (Dynamic Random Access Memory) comprises an array of memory cells arranged in rows and columns. An intersection of a row and a column defines an address of a memory cell location. In general, each of the memory cells comprises a capacitor for storing charge and a transistor for gating that charge onto a bit line. A charge is a representation of a data bit, and the charge stored in the capacitor determines whether the bit is considered a logic "1" or a logic "0". In general, a high voltage represents a logic "1" and a low voltage represents a logic "0". Data may be stored in the memory during a write operation, and may be read out during a read operation.

A capacitor is charged when the data is stored in the DRAM cell in the write cycle, and the amount of charge stored in the capacitor is sensed to estimate the logic state of the memory cell when the data is read out from the memory cell in the subsequent read cycle. However, a general DRAM needs a so-called "refresh operation" because the capacitor in the memory cell is subject to charge leakage so that the data stored will be lost, unless the charge is refreshed periodically. Refresh logic is commonly used with DRAMs to automate the periodic refresh.

In the conventional DRAM, during a read of any memory cell, the entire row is read out and written back in (refresh); during a write to any memory cell, the entire row is read out, one value is changed, and the entire row is written back in. Data may be read by activating the row that is called a "word line".

A word line couples all the memory cells that belong to the row to the bit lines that define the columns of the memory array. When a particular word line is activated, a sense amplifier detects and amplifies the data that is in the activated bit/column line. The sense amplifier senses whether logic "1" or logic "0" is stored in the memory location.

One method to improve an access time and a cycle time is to decrease the length of each word line and to decrease the number of word lines per memory cell array. That is, the method improves the access time by decreasing the capacitance load generated by the word lines. To implement this method, the technology for forming multiple banks by arranging the DRAM memory cells in operational units or "banks" was widely adopted. Generally, address buses, arranged in the peripheral circuit area or "backbone", transfer memory cell addresses and data for read, write, and refresh operations in each of the banks.

A semiconductor memory device having a stacked-bank architecture has been designed to reduce power consumption. FIG. 1 is a block diagram illustrating a conventional DRAM having a stacked-bank architecture. Referring to FIG. 1, a DRAM includes memory bank groups 100, 200, 300, and 400 (shown by dashed lines), and a decoder unit 500. The memory bank groups 100, 200, 300, and 400 are comprised of memory banks. For example, the memory bank group 100 is comprised of memory banks (BANK 1A) 110, (BANK 1B) 120, (BANK 1C) 130, and (BANK 1D) 140. Each of the memory bank groups 100, 200, 300, and 400 activates word lines of a memory cell array in response to the decoded row address signal DRAij.

The decoder unit 500 generates the row address signal DRAij in response to an external address signal XRA. Referring to FIG. 1, the row address signal DRAij outputted from the decoder unit 500 is transferred to all of the memory banks within a memory bank group.

FIG. 2 is a detailed circuit diagram illustrating a memory bank group in the DRAM of FIG. 1. Referring to FIG. 2, the memory bank 100 includes memory banks 110, 120, 130, and 140. Each of the memory banks 110, 120, 130, and 140 includes a main decoder unit (116, 126, 136 and 146, respectively), a word line driving unit (114, 124, 134 and 144, respectively) and a memory cell array (112, 122, 132 and 142, respectively). The decoded row address signal DRAij is not only applied to the main decoder 116 that is in the memory bank 110, but also applied to the main decoder 126 that is in the memory bank 120. Further, the decoded row address signal DRAij is not only applied to the main decoder 136 that is in the memory bank 130, but also applied to the main decoder 146 that is in the memory bank 140.

The signals PA, PB, PC, and PD that have memory bank information are applied to the main decoder unit 116, 126, 136, and 146 to activate or inactivate word lines.

Referring to FIG. 1 and FIG. 2, in the conventional semiconductor memory device having a stacked-bank architecture, signal lines reaching word lines of all the memory banks are activated simultaneously because the decoded row address signal DRAij is transferred to all of the memory banks within a memory bank group. Therefore, the device consumes electric power unnecessarily. In addition, as shown in FIG. 1, in the conventional semiconductor memory device having a stacked-bank architecture, the length of a signal line reaching each memory bank, e.g., BANK 1A, BANK 2A, BANK 3A or BANK 4A, is different. If the length of signal line is not matched with respect to the memory banks, the semiconductor memory device may not operate normally when noise is generated.

SUMMARY OF THE INVENTION

A semiconductor memory device having a stacked-bank architecture according to an embodiment of the present invention is adapted to enable decoded row address signals selectively with respect to memory banks, and activate word lines coupled to memory cells selectively with respect to the memory banks.

A semiconductor memory device having a stacked-bank architecture according to an embodiment of the present invention consumes lower power and operates stably against noise.

According to one exemplary embodiment of the present invention, there is provided a semiconductor memory device including a plurality of memory bank groups, and a decoder unit. Each memory bank group includes a plurality of memory banks arranged in a stacked-bank architecture. The decoder unit generates a decoded row address signal to individually select one of the memory banks associated with that signal in response to an external address signal under the control of an output enable signal.

The decoder unit includes an address buffer, a pre-decoder unit, and an output buffer unit. The address buffer receives and latches the external address signals to generate a row address signal, the row address signal corresponding to the external address signal. The pre-decoder unit decodes the row address signal to generate a pre-decoded row address signal to individually select one of the memory banks associated with that signal. The output buffer unit enables the pre-decoded row address signal selectively with respect to the memory banks in response to the output enable signal, to generate a decoded row address signal.

Each of the memory banks includes a memory cell array, a main decoder unit, and a word line driving unit. The main decoder unit generates a word line enable signal and word line boosting signal in response to the decoded row address signal to individually select one of the memory banks associated with that signal. The word line driving unit activates a word line of the memory cell array selectively with respect to the memory banks in response to the word line enable signal and the word line boosting signal.

The memory banks in each memory bank group may be arranged in two rows. The main decoder unit may be located between a memory bank in a first row and a memory bank in a second row. The decoder unit may be arranged among the memory bank groups. The output enable signals are generated selectively with respect to the memory banks in response to a row address strobe signal and a bank address signal.

In at least one embodiment of the present invention, the semiconductor memory device may further include an output enable signal generating circuit for generating the output enable signals that are generated selectively with respect to the memory banks in response to a bank address signal, and configured to be activated by the row address strobe signal. The output enable signal generating circuit may include a bank selection signal generating circuit and a pulse-width modulating unit. The bank selection signal generating circuit includes a bank selection signal generating circuit and a pulse-width modulating unit. The bank selection signal generating circuit generates bank selection signals having a pulse form that is selective with respect to the banks, and the bank selection signals have memory bank information. The pulse-width modulating unit is configured to modulate a pulse width of the bank selection signals to generate the output enable signals.

According to another embodiment of the present invention, there is provided a method of driving word lines of a semiconductor memory device. This method includes generating a decoded row address signal to individually select one of the memory banks associated with that signal in response to an external address signal under the control of an output enable signal, generating a word line enable signal and word line boosting signal in response to the decoded row address signal to individually select one of the memory banks associated with that signal, and activating a word line of a memory cell array in each of the memory banks in response to the word line enable signal and the word line boosting signal.

The method may further include latching the external address signals to generate row address signals, each of the row address signals corresponding to the external address signals, decoding the row address signals to generate pre-decoded row address signals to individually select one of the memory banks associated with that signal, and enabling the pre-decoded row address signals selectively with respect to the memory banks in response to the output enable signal, to generate decoded row address signals.

BRIEF DESCRIPTION OF THE DRAWINGS

The present invention will become more apparent to those of ordinary skill in the art when descriptions of exemplary embodiments thereof are read with reference to the accompanying drawings, of which.

DETAILED DESCRIPTION OF THE EXEMPLARY EMBODIMENTS

Figure 1:
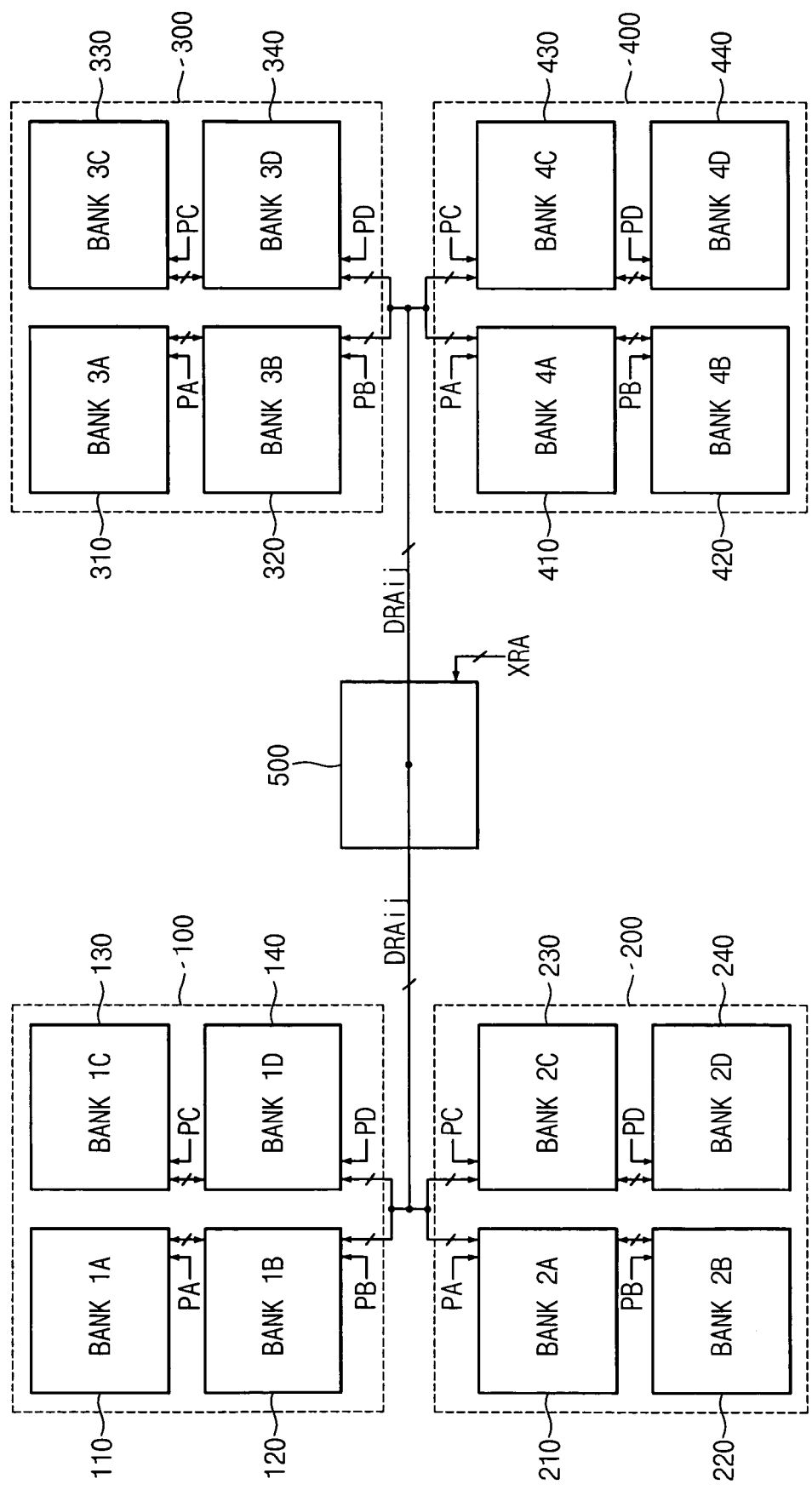
FIG. 1 is a block diagram illustrating a conventional DRAM having a stacked-bank architecture.
Figure 2:
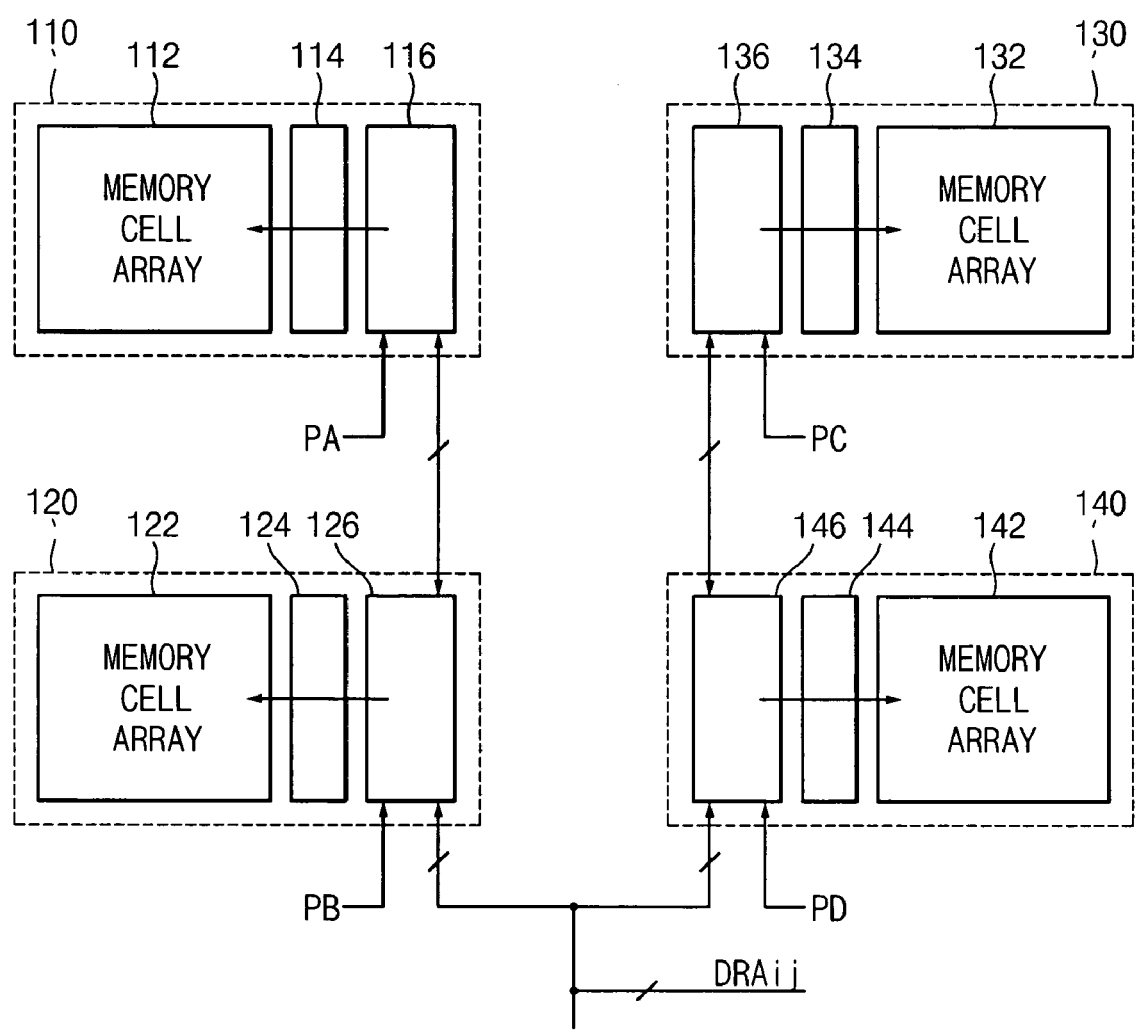
FIG. 2 is a detailed circuit diagram illustrating a memory bank group in the DRAM of FIG. 1.

Hereinafter, exemplary embodiments of the present invention will be described in detail with reference to the accompanying drawings. However, specific structural and functional details disclosed herein are merely representative for purposes of describing exemplary embodiments of the present invention. Like reference numerals refer to similar or identical elements throughout the description of the figures.

Figure 3:
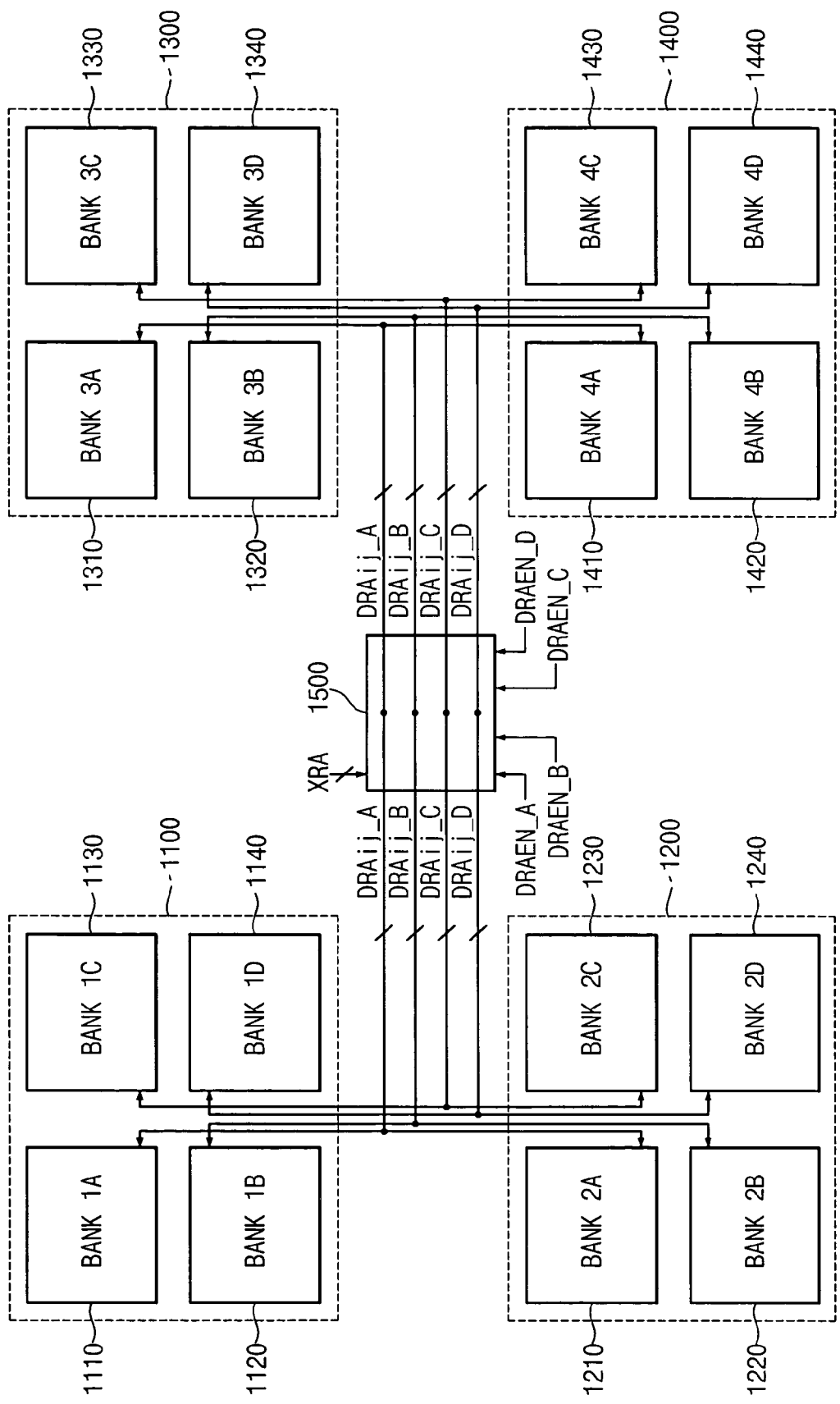
FIG. 3 is a block diagram illustrating a DRAM having a stacked-bank architecture, according to an exemplary embodiment of the present invention.

FIG. 3 is a block diagram illustrating a DRAM having a stacked-bank architecture according to the present invention, and illustrates a DRAM having four memory bank groups. Referring to FIG. 3, a DRAM includes memory bank groups 1100, 1200, 1300, and 1400, and a decoder unit 1500. The memory bank group 1100 is comprised of memory banks (BANK 1A) 1110, (BANK 1B) 1120, (BANK 1C) 1130, and (BANK 1D) 1140. The memory bank group 1200 is comprised of memory banks (BANK 2A) 1210, (BANK 2B) 1220, (BANK 2C) 1230, and (BANK 2D) 1240. The memory bank group 1300 is comprised of memory banks (BANK 3A) 1310, (BANK 3B) 1320, (BANK 3C) 1330, and (BANK 3D) 1340. The memory bank group 1400 is comprised of memory banks (BANK 4A) 1410, (BANK 4B) 1420, (BANK 4C) 1430, and (BANK 4D) 1440. Each of the respective memory bank groups 1100, 1200, 1300, and 1400 activates a word line of a memory cell array selectively in response to decoded row address signal DRAij_A, DRAij_B, DRAij_C, and DRAij_D to individually select one of the respective memory banks.

The decoder unit 1500 generates row address signals DRAij_A, DRAij_B, DRAij_C, and DRAij_D to individually select one of the memory banks associated with that signal in response to the external address signal XRA under the control of output enable signals DRAEN_A, DRAEN_B, DRAEN_C, and DRAEN_D that have memory bank information. Referring to FIG. 3, the decoded row address signal DRAij_A is applied to the memory banks 1110 (BANK 1A) in the memory bank group 1100, (BANK 2A) 1210 in the memory bank group 1200, (BANK 3A) 1310 in the memory bank group 1300, and (BANK 4A) 1410 in the memory bank group 1400. The decoded row address signal DRAij_B is applied to the memory banks 1120 (BANK 1B) in the memory bank group 1100, (BANK 2B) 1220 in the memory bank group 1200, (BANK 3B) 1320 in the memory bank group 1300, and (BANK 4B) 1420 in the memory bank group 1400. The decoded row address signal DRAij_C is applied to the memory banks (BANK 1C) 1130 in the memory bank group 1100, (BANK 2C) 1230 in the memory bank group 1200, (BANK 3C) 1330 in the memory bank group 1300, and (BANK 4C) 1430 in the memory bank group 1400. The decoded row address signal DRAij_D is applied to the memory banks (BANK 1D) 1140 in the memory bank group 1100, (BANK 2D) 1240 in the memory bank group 1200, (BANK 3D) 1340 in the memory bank group 1300, and (BANK 4D) 1440 in the memory bank group 1400.

Figure 4:
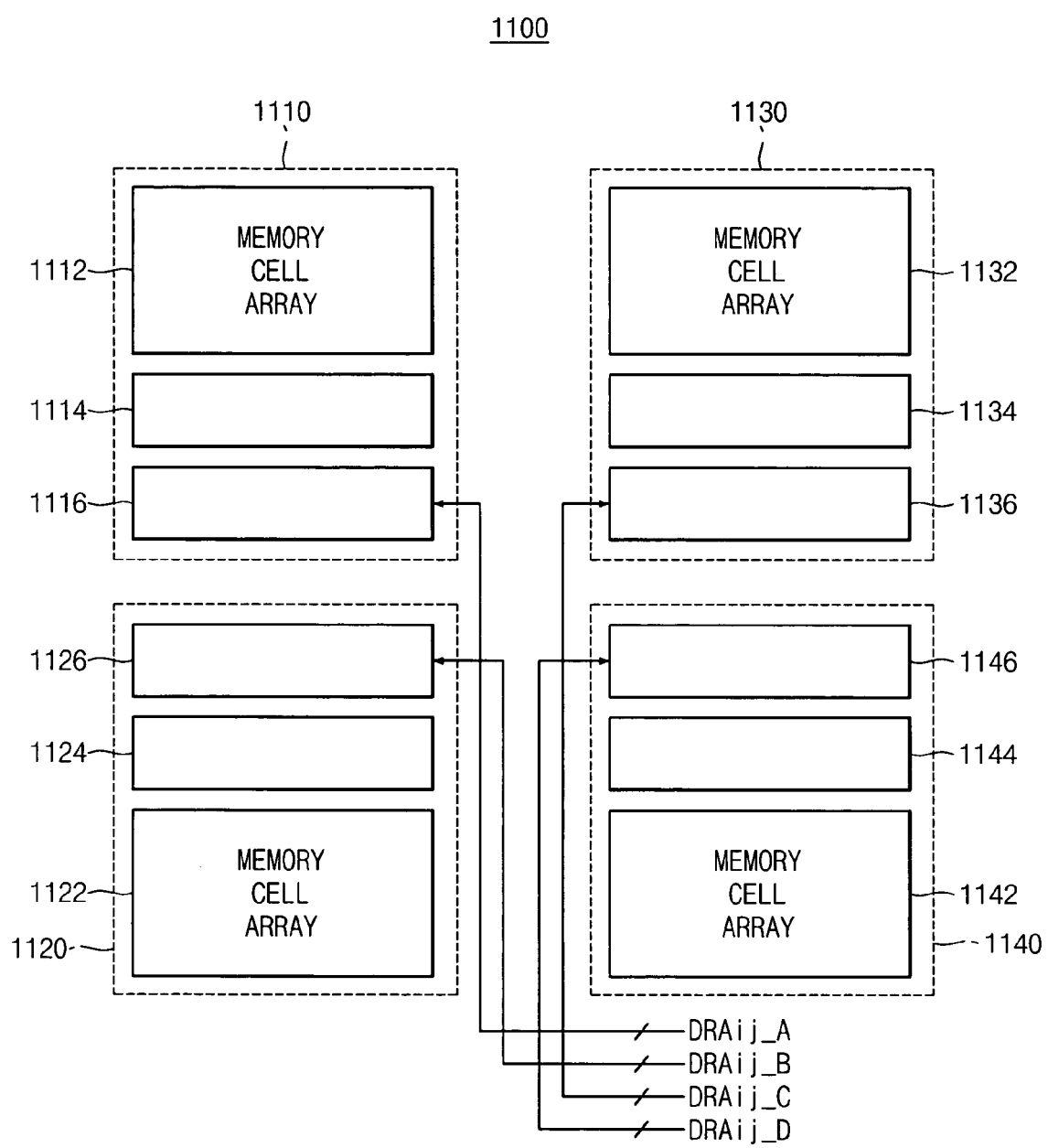
FIG. 4 is a block diagram illustrating a memory bank group in the DRAM of FIG. 3, according to an exemplary embodiment of the present invention.

FIG. 4 is a block diagram illustrating a memory bank group in the DRAM of FIG. 3. Referring to FIG. 4, the memory bank group 1100 includes memory banks 1110, 1120, 1130, and 1140. Each of the memory banks 1110, 1120, 1130, and 1140 includes a main decoder unit (1116, 1126, 1136 and 1146, respectively), a word line driving unit (1114, 1124, 1134 and 1144, respectively) and a memory cell array (1112, 1122, 1132 and 1142, respectively). The decoded row address signal DRAij_A is applied to the main decoder unit 1116 of the memory bank (BANK 1A) 1110. The decoded row address signal DRAij_B is applied to the main decoder unit 1126 of the memory bank (BANK 1B) 1120. The decoded row address signal DRAij_C is applied to the main decoder unit 1136 of the memory bank (BANK 1C) 1130. The decoded row address signal DRAij_D is applied to the main decoder unit 1146 of the memory bank (BANK 1D) 1140.

Figure 5:
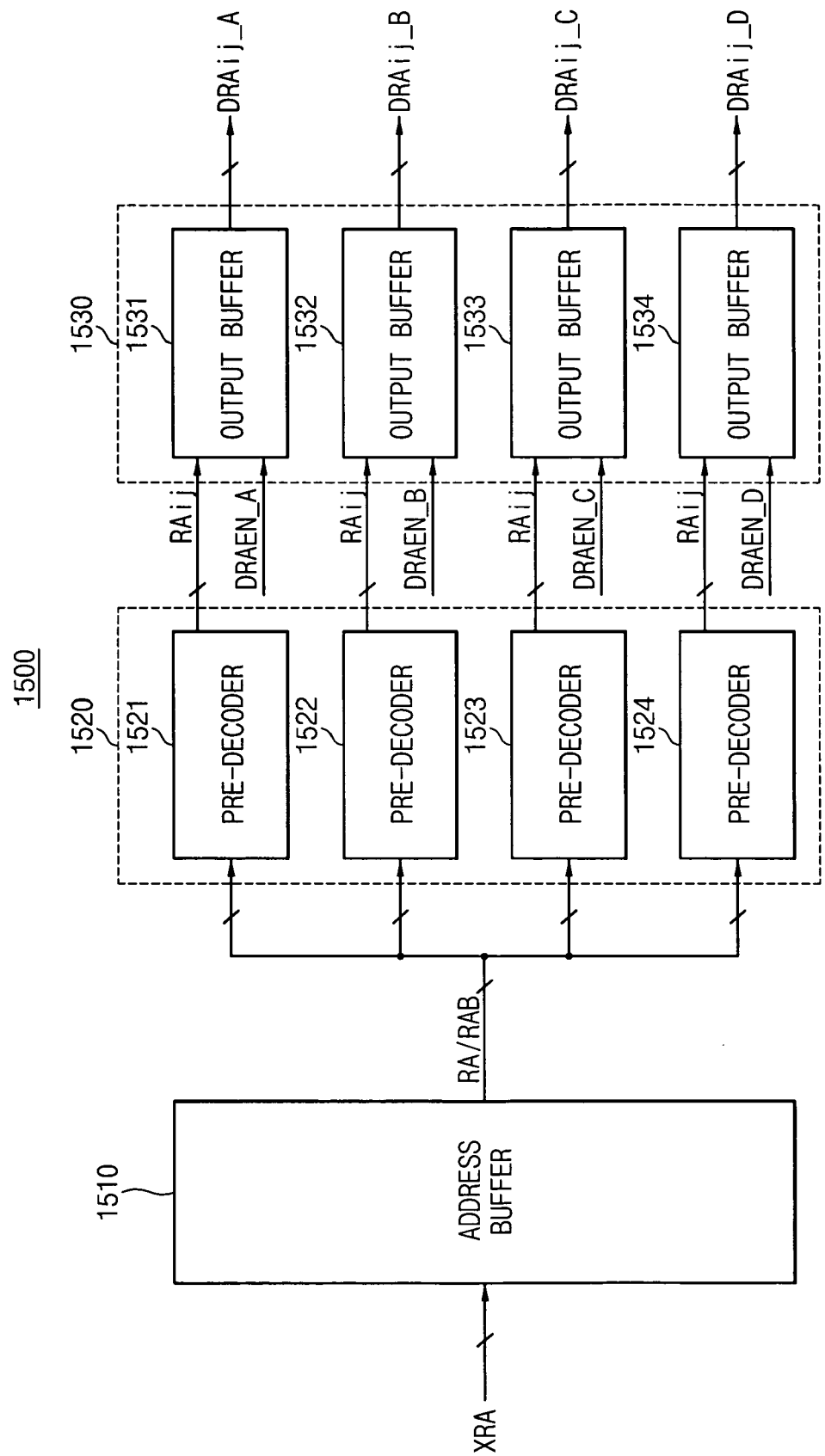
FIG. 5 is a block diagram illustrating a decoder unit in the DRAM of FIG. 3, according to an exemplary embodiment of the present invention.

FIG. 5 is a block diagram illustrating a decoder unit in the DRAM of FIG. 3. Referring to FIG. 5, the decoder unit 1500 includes an address buffer 1510, a pre-decoder unit 1520, and an output buffer unit 1530. The pre-decoder unit 1520 includes pre-decoders 1521, 1522, 1523 and 1524, and the output buffer unit 1530 includes output buffers 1531, 1532, 1533 and 1534.

The address buffer 1510 receives and latches external address signals XRA to generate row address signals RA/RAB corresponding to the external address signals XRA. The pre-decoder unit 1520 executes logical operations on the row address signals RA/RAB to generate pre-decoded row address signals RAij to individually select one of the memory banks associated with that signal. The output signals of the pre-decoder unit 1520 are divided into several parts to be output. For example, the output of the pre-decoder 1521 may be represented as RA234<0:7>, the output of the pre-decoder 1522 as RA56<0:3>, the output of the pre-decoder 1523 as RA78<0:3>, and the output of the pre-decoder 1524 as RA910<0:3>. The output buffer unit 1530 receives the pre-decoded row address signals RAij and enables the pre-decoded row address signals RAij selectively with respect to the memory banks to generate decoded row address signals DRAij_A, DRAij_B, DRAij_C, and DRAij_D in response to output enable signals DRAEN_A, DRAEN_B, DRAEN_C, and DRAEN_D.

Figure 6:
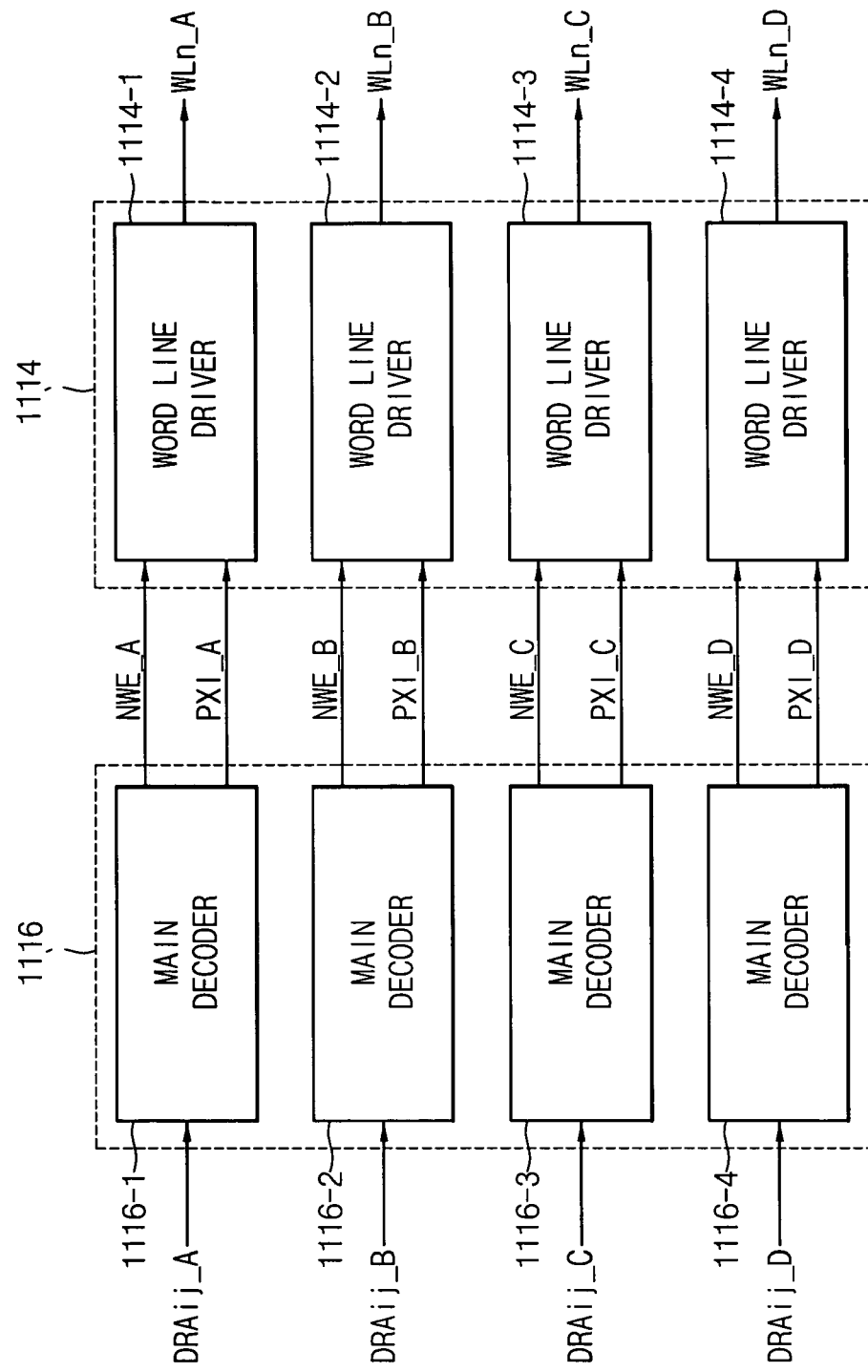
FIG. 6 is a block diagram illustrating a main decoder unit and a word line driving unit in each of the memory banks of FIG. 4, according to an exemplary embodiment of the present invention.

FIG. 6 is a block diagram illustrating a main decoder unit and a word line driving unit in each of the memory banks of FIG. 4. Referring to FIG. 6, the main decoder unit 1116 includes main decoders 1116-1, 1116-2, 1116-3, and 1116-4. The main decoder 1116-1 receives the decoded row address signal DRAij_A to generate a word line enable signal NWE_A and a word line boosting signal PXI_A. The main decoder 1116-2 receives the decoded row address signal DRAij_B to generate a word line enable signal NWE_B and a word line boosting signal PXI_B. The main decoder 1116-3 receives the decoded row address signal DRAij_C to generate a word line enable signal NWE_C and a word line boosting signal PXI_C. The main decoder 1116-4 receives the decoded row address signal DRAij_D to generate a word line enable signal NWE_D and a word line boosting signal PXI_D.

The word line driving unit 1114 includes word line drivers 1114-1, 1114-2, 1114-3, and 1114-4. The word line driver 1114-1 generates an n-th word line control signal WLn_A of the memory bank BANK_A in response to the word line enable signal NWE_A and the word line boosting signal PXI_A. The word line driver 1114-2 generates an n-th word line control signal WLn_B of the memory bank BANK_B in response to the word line enable signal NWE_B and the word line boosting signal PXI_B. The word line driver 1114-3 generates an n-th word line control signal WLn_C of the memory bank BANK_C in response to the word line enable signal NWE_C and the word line boosting signal PXI_C. The word line driver 1114-4 generates an n-th word line control signal WLn_D of the memory bank BANK_D in response to the word line enable signal NWE_D and the word line boosting signal PXI_D.

Figure 7:
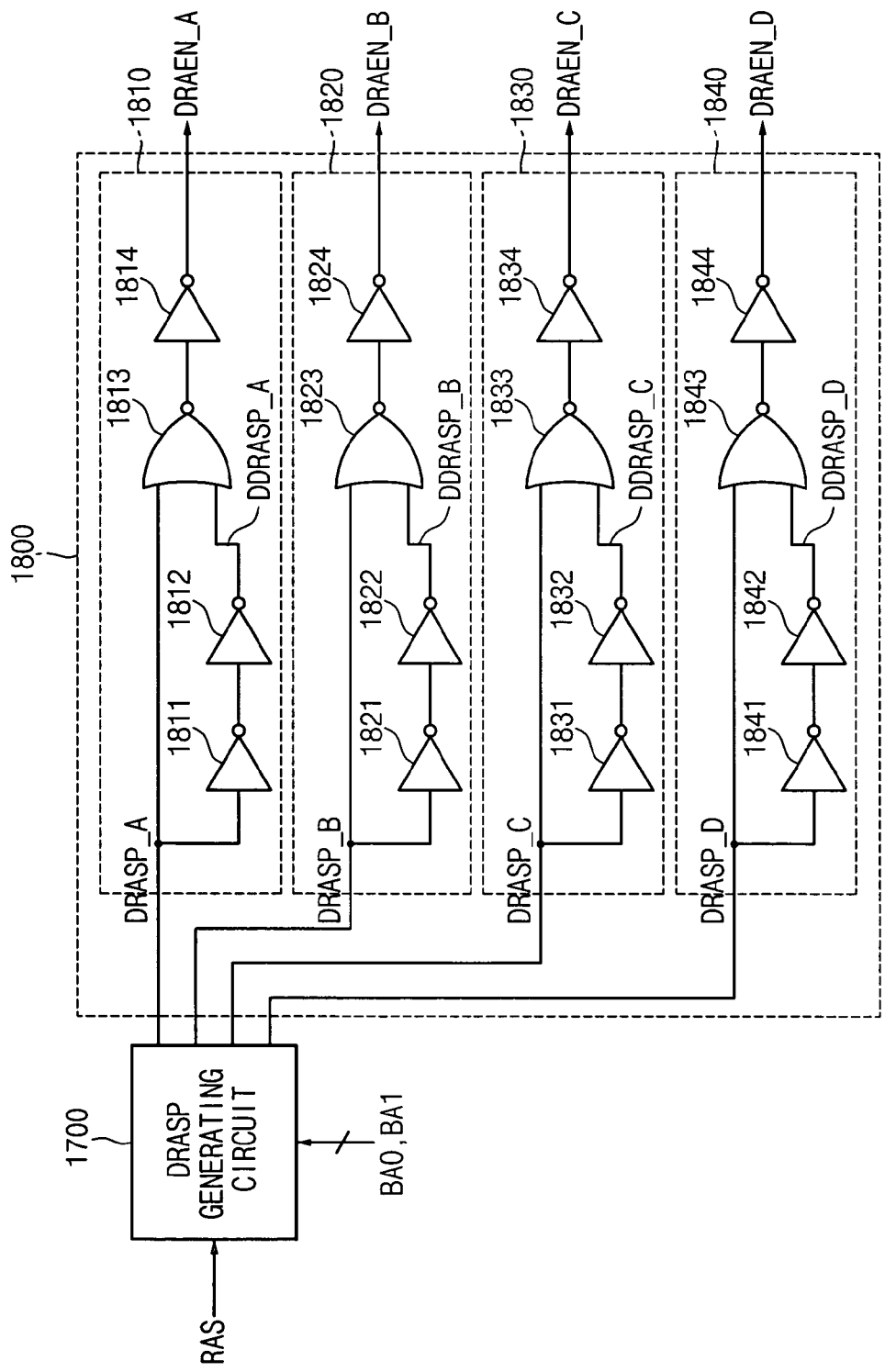
FIG. 7 is a circuit diagram illustrating an output enable signal generating circuit for generating a row address output enable signal that is applied to the decoded row address output enable signal, according to an exemplary embodiment of the present invention.

FIG. 7 is a circuit diagram illustrating an output enable signal generating circuit for generating a row address output enable signal that is applied to the decoded row address output enable signal. Referring to FIG. 7, the output enable signal generating circuit includes a bank selection signal generating circuit 1700 and a pulse-width modulating unit 1800. The bank selection signal generating circuit 1700 generates bank selection signals DRASP_A, DRASP_B, DRASP_C, and DRASP_D in response to a row address strobe signal RAS and bank address signals BA0 and BA1, each of the bank selection signals DRASP_A, DRASP_B, DRASP_C, and DRASP_D having a form of short pulse that has memory bank information. The bank selection signals DRASP_A, DRASP_B, DRASP_C, and DRASP_D are generated selectively with respect to the memory banks in response to the bank address signals BA0 and BA1, and activated by the RAS signal. The pulse-width modulating unit 1800 receives the bank selection signals DRASP_A, DRASP_B, DRASP_C, and DRASP_D and adjusts the pulse widths of the bank selection signals DRASP_A, DRASP_B, DRASP_C, and DRASP_D to generate the output enable signals DRAEN_A, DRAEN_B, DRAEN_C, and DRAEN_D.

The pulse-width modulating unit 1800 includes pulse-width modulating circuits 1810, 1820, 1830 and 1840. The pulse-width modulating circuit 1810 generates the output enable signal DRAEN_A having a predetermined pulse width in response to the bank selection signal DRASP_A. The pulse-width modulating circuit 1820 generates the output enable signal DRAEN_B having a predetermined pulse width in response to the bank selection signal DRASP_B. The pulse-width modulating circuit 1830 generates the output enable signal DRAEN_C having a predetermined pulse width in response to the bank selection signal DRASP_C. The pulse-width modulating circuit 1840 generates the output enable signal DRAEN_D having a predetermined pulse width in response to the bank selection signal DRASP_D.

The pulse-width modulating circuit 1810, according to an embodiment of the present invention, includes a delay circuit that is comprised of inverters 1811 and 1812, a NOR gate 1813, and an inverter 1814. The delay circuit delays the bank selection signal DRASP_A a predetermined time to generate a delayed bank selection signal DDRASP_A. The NOR gate 1813 and the inverter 1814 function as an OR gate, and executes a logical OR operation on the bank selection signal DRASP_A and the delayed bank selection signal DDRASP_A to generate the output enable signal DRAEN_A. Each of the pulse-width modulating circuits 1820, 1830 and 1840 has the same circuit structure and operates in the same manner as the pulse-width modulating circuit 1810, except that the respective input signals and output signals of the pulse-width modulating circuits 1820, 1830 and 1840 are different.

Figure 8:
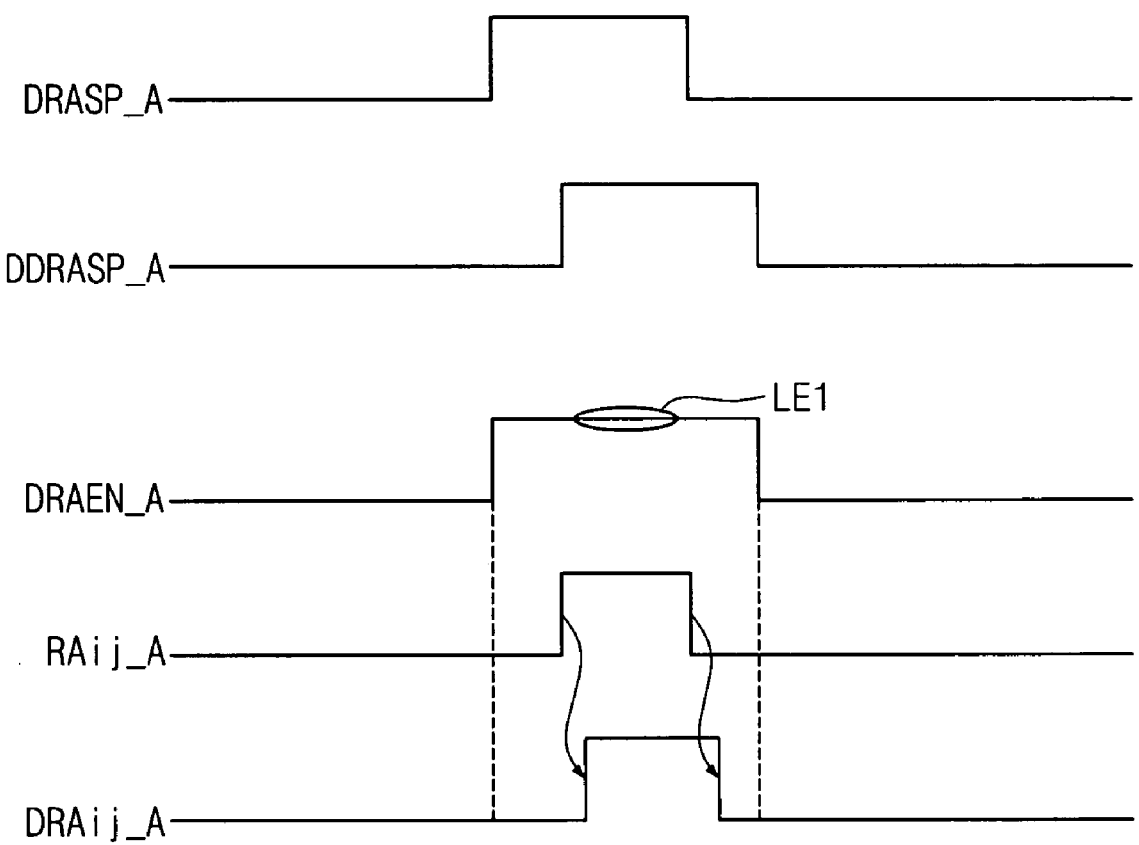
FIG. 8 is a timing diagram illustrating a process of generating decoded row address signals in a decoder unit of FIG. 5, according to an exemplary embodiment of the present invention.

FIG. 8 is a timing diagram illustrating a process of generating decoded row address signals in a decoder unit of FIG. 5. Referring to FIG. 8, when a logical OR operation is executed on the bank selection signal DRASP_A and the delayed bank selection signal DDRASP_A, the output enable signal DRAEN_A having a pulse width wider than the pulse width of the bank selection signal DRASP_A is generated. Because the output enable signal DRAEN_A maintains logic "high" level LE1, a pre-decoded row address signal RAij_A is outputted as a decoded row address signal DRAij_A having a logic "high" state.

Hereinafter, a semiconductor memory device having a stacked-bank architecture according to an embodiment of the present invention will be described with reference to FIG. 3 to FIG. 8.

Referring to FIG. 3, the decoder unit 1500 generates decoded row address signals DRAij_A, DRAij_B, DRAij_C, and DRAij_D to individually select one of the memory banks associated with that signal in response to the external address signal XRA. When the decoded row address signal DRAij_A is enabled, only address buses carrying the row address signal DRAij_A are activated, the rest of the address buses are not activated.

When the decoded row address signal DRAij_A is enabled, word lines in the memory banks 1110, 1210, 1310, and 1410 are activated. When the decoded row address signal DRAij_B is enabled, word lines in the memory banks 1120, 1220, 1320 and 1420 are activated. When the decoded row address signal DRAij_C is enabled, word lines in the memory banks 1130, 1230, 1330 and 1430 are activated. When the decoded row address signal DRAij_D is enabled, word lines in the memory banks 1140, 1240, 1340 and 1440 are activated.

In the case of four bytes of data to be stored in the memory cell array, when the decoded row address signal DRAij_A is enabled, one of the four bytes is stored in the memory bank (BANK 1A) 1110, another one of the four bytes is stored in the memory bank (BANK 2A) 1210, another one is stored in the memory bank (BANK 3A) 1310, and another is stored in the memory bank (BANK 4A) 1410.

In the case of four bytes of data to be stored in the memory cell array, when the decoded row address signal DRAij_B is enabled, one of the four bytes is stored in the memory bank (BANK 1B) 1120, another one of the four bytes is stored in the memory bank (BANK 2B) 1220, another one is stored in the memory bank (BANK 3B) 1320, and another is stored in the memory bank (BANK 4B) 1420.

In the case of four bytes of data to be stored in the memory cell array, when the decoded row address signal DRAij_C is enabled, one of the four bytes is stored in the memory bank (BANK 1C) 1130, another one of the four bytes is stored in the memory bank (BANK 2C) 1230, another one is stored in the memory bank (BANK 3C) 1330, and another is stored in the memory bank (BANK 4C) 1430.

In the case of four bytes of data to be stored in the memory cell array, when the decoded row address signal DRAij_D is enabled, one of the four bytes is stored in the memory bank (BANK 1D) 1140, another one of the four bytes is stored in the memory bank (BANK 2D) 1240, another one is stored in the memory bank (BANK 3D) 1340, and another is stored in the memory bank (BANK 4D) 1440.

Referring to FIG. 4, the area in which the main decoder unit 1116 and the word line driving unit 1114 in the memory bank 1110 are located is near the area in which the main decoder unit 1126 and the word line driving unit 1124 in the memory bank 1120 are located. The area in which the main decoder unit 1136 and the word line driving unit 1134 in the memory bank 1130 are located is near the area in which the main decoder unit 1146 and the word line driving unit 1144 in the memory bank 1140 are located.

Referring to the decoder unit 1500 of FIG. 5, the external address signal XRA is latched and transformed into the row address signal RA/RAB by the address buffer 1510, and the row address signal RA/RAB is transformed into the pre-decoded row address signal RAij by the pre-decoder unit 1520. The output buffer unit 1530 enables the pre-decoded row address signal RAij selectively with respect to the memory banks under the control of the output enable signals DRAEN_A, DRAEN_B, DRAEN_C, and DRAEN_D, and generates the decoded row address signals DRAij_A, DRAij_B, DRAij_C, and DRAij_D. Therefore, the decoded row address signals outputted from the decoder unit 1500 are selective with respect to the memory banks.

Referring to FIG. 6, the main decoder unit 1116 receives the recoded row address signals DRAij_A, DRAij_B, DRAij_C, and DRAij_D and generates the word line control signals WLn_A, WLn_B, WLn_C, and WLn_D to drive word lines of each of memory banks.

For example, when the row address signal DRAij_A is enabled, the word line control signal WLn_A is enabled and a word line coupled to the word line driver 1114-1 is activated. In the same manner, when the row address signal DRAij_B is enabled, the word line control signal WLn_B is enabled and a word line coupled to the word line driver 1114-2 is activated. When the row address signal DRAij_C is enabled, the word line control signal WLn_C is enabled and a word line coupled to the word line driver 1114-3 is activated. When the row address signal DRAij_D is enabled, the word line control signal WLn_D is enabled and a word line coupled to the word line driver 1114-4 is activated.

When the word line control signal WLn_A is enabled, word lines that belong to the memory banks BANK 1A, BANK 2A, BANK 3A, and BANK 4A are activated at the same time. In the same manner, when the word line control signal WLn_B is enabled, word lines that belong to the memory banks BANK 1B, BANK 2B, BANK 3B, and BANK 4B are activated at the same time. When the word line control signal WLn_C is enabled, word lines that belong to the memory banks BANK 1C, BANK 2C, BANK 3C, and BANK 4C are activated at the same time. When the word line control signal WLn_D is enabled, word lines that belong to the memory banks BANK 1D, BANK 2D, BANK 3D, and BANK 4D are activated at the same time.

Referring to FIG. 7, the output enable signals DRAEN_A, DRAEN_B, DRAEN_C, and DRAEN_D are generated using the row address strobe signal RAS and the bank address signals BA0 and BA1. The bank selection signal generating circuit 1700 receives the bank address signals BA0 and BA1 and the row address strobe signal RAS to generate the bank selection signals DRASP_A, DRASP_B, DRASP_C, and DRASP_D, each of the bank selection signals DRASP_A, DRASP_B, DRASP_C, and DRASP_D having a form of short pulse that has memory bank information. The bank selection signals DRASP_A, DRASP_B, DRASP_C, and DRASP_D are generated selectively with respect to the memory banks in response to the bank address signals BA0 and BA1, and activated by the row address strobe signal RAS. The pulse-width modulating unit 1800 receives the bank selection signals DRASP_A, DRASP_B, DRASP_C, and DRASP_D and adjusts the pulse widths of the bank selection signals DRASP_A, DRASP_B, DRASP_C, and DRASP_D. According to an embodiment of the present invention, there may be as many of the pulse-width modulating units 1800 as the number of memory banks in a memory bank group.

Referring to FIG. 8, when the output enable signal DRAEN_A maintains a logic "high" level LE1, the pre-decoded row address signal RAij_A is outputted as a decoded row address signal DRAij_A having a logic "high" state.

Heretofore, a semiconductor memory device with four memory bank groups, each of the memory bank groups having four memory banks was described. However, it should be understood that a semiconductor memory device in accordance with the present invention can be implemented with an arbitrary number of memory bank groups, with each of the memory bank groups having an arbitrary number of memory banks.

FIG. 9A to FIG. 9H is a diagram illustrating activated signal buses that extend from a decoder unit located in the peripheral circuit to each bank when each of the word lines is activated for a 512 Mbit DRAM having four memory bank groups, wherein each of the memory bank groups includes eight memory banks A, B, C, D, E, F, G, and H.

In a semiconductor memory device with memory bank groups having eight memory banks respectively, a bank address signal applied to a bank selection signal generating circuit will have three bits. For example, a bank address signal may have bits BA0, BA1, and BA2, and bank selection signals generated by the bank selection signal generating circuit 1700 of FIG. 7 may be DRASP_A, DRASP_B. DRASP_C, DRASP_D, DRASP_E, DRASP_F, DRASP_G, and DRASP_H. The output enable signals may be DRAEN_A, DRAEN_B, DRAEN_C, DRAEN_D, DRAEN_E, DRAEN_F, DRAEN_G, and DRAEN_H.

Figure 9A:
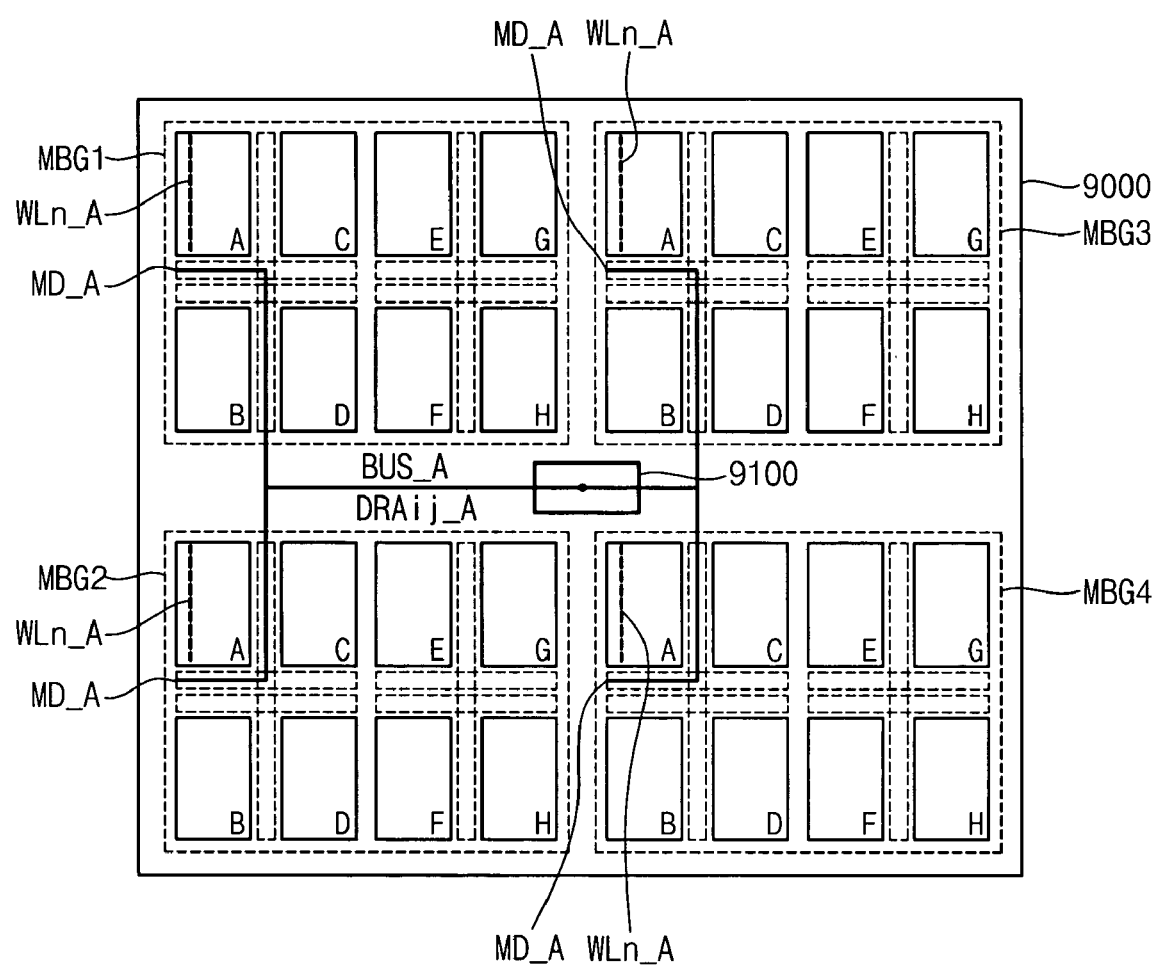
FIG. 9A to FIG. 9H are diagrams illustrating activated signal buses that extend from a decoder unit located in the peripheral circuit to each bank when each of the word lines is activated for a 512 Mbit DRAM having four memory bank groups, wherein each of the memory bank groups includes eight memory banks A, B, C, D, E, F, G, and H, according to exemplary embodiments of the present invention.
Figure 9B:
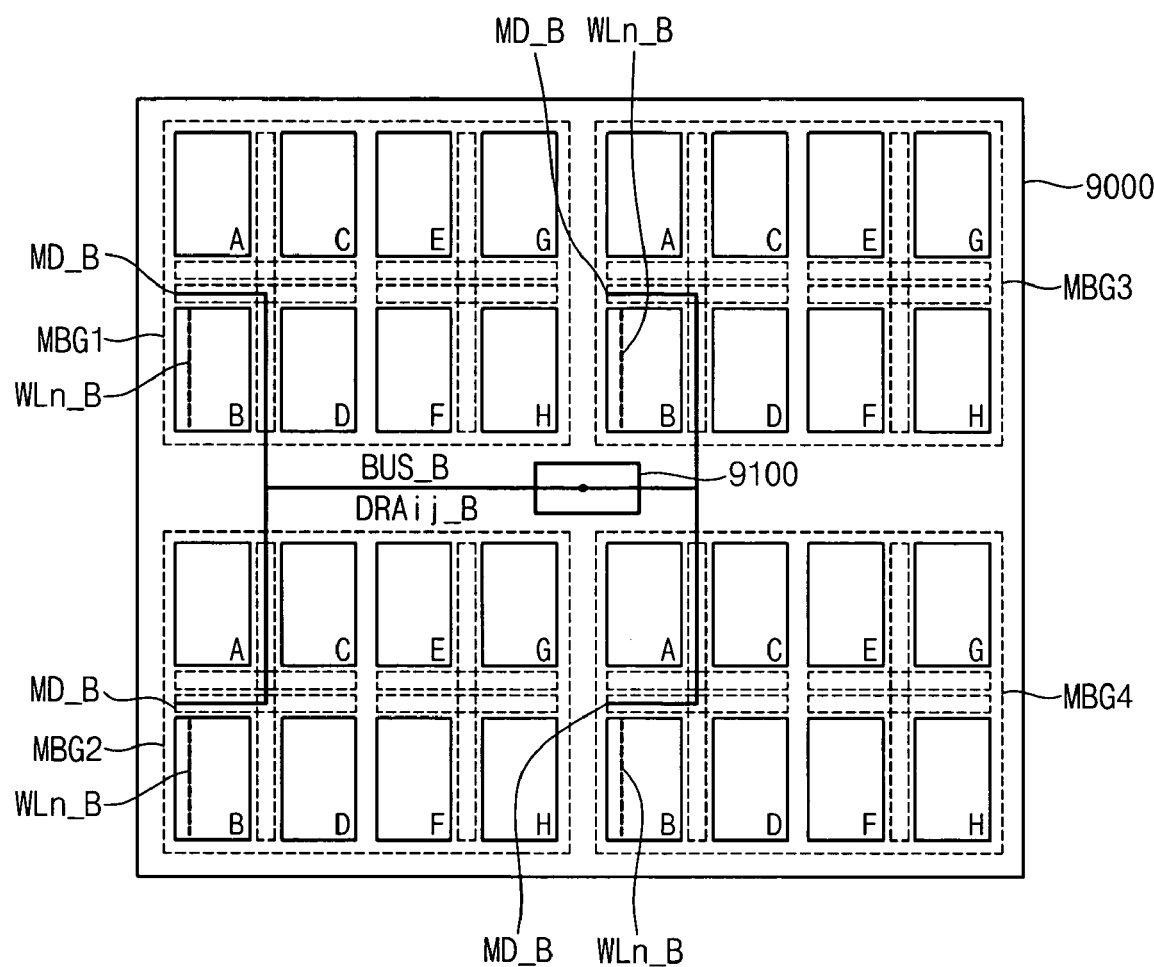
Figure 9C:
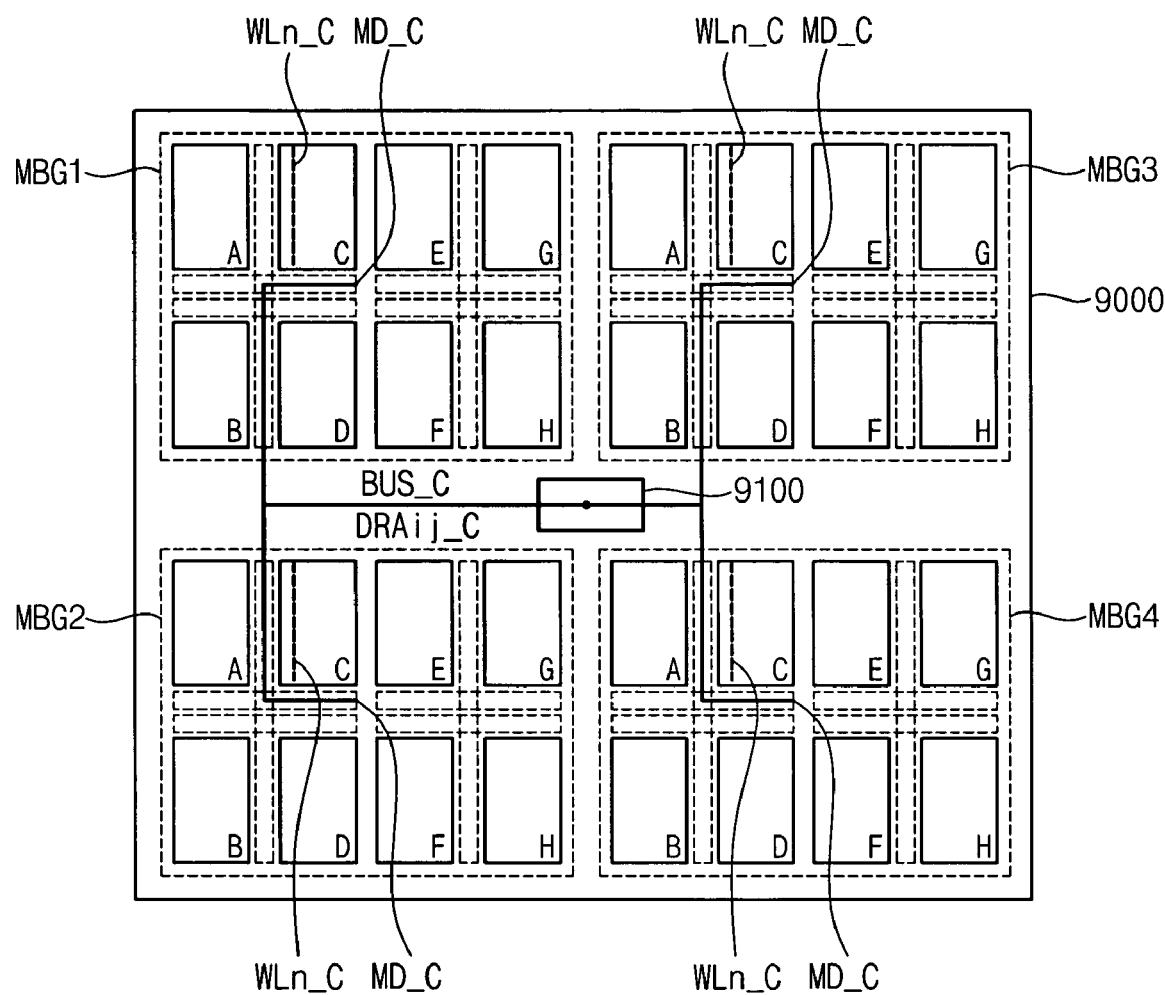
Figure 9D:
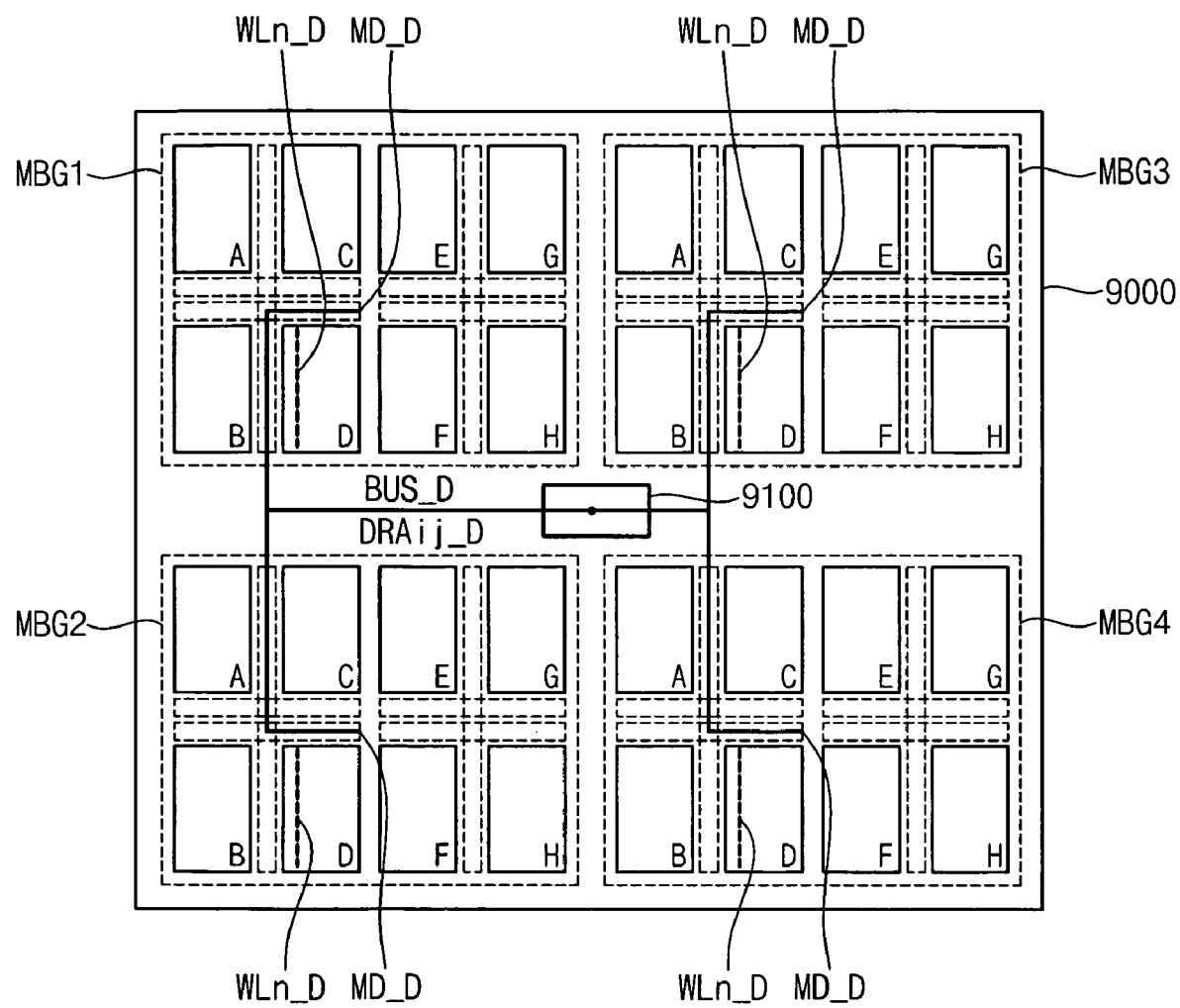
Figure 9E:
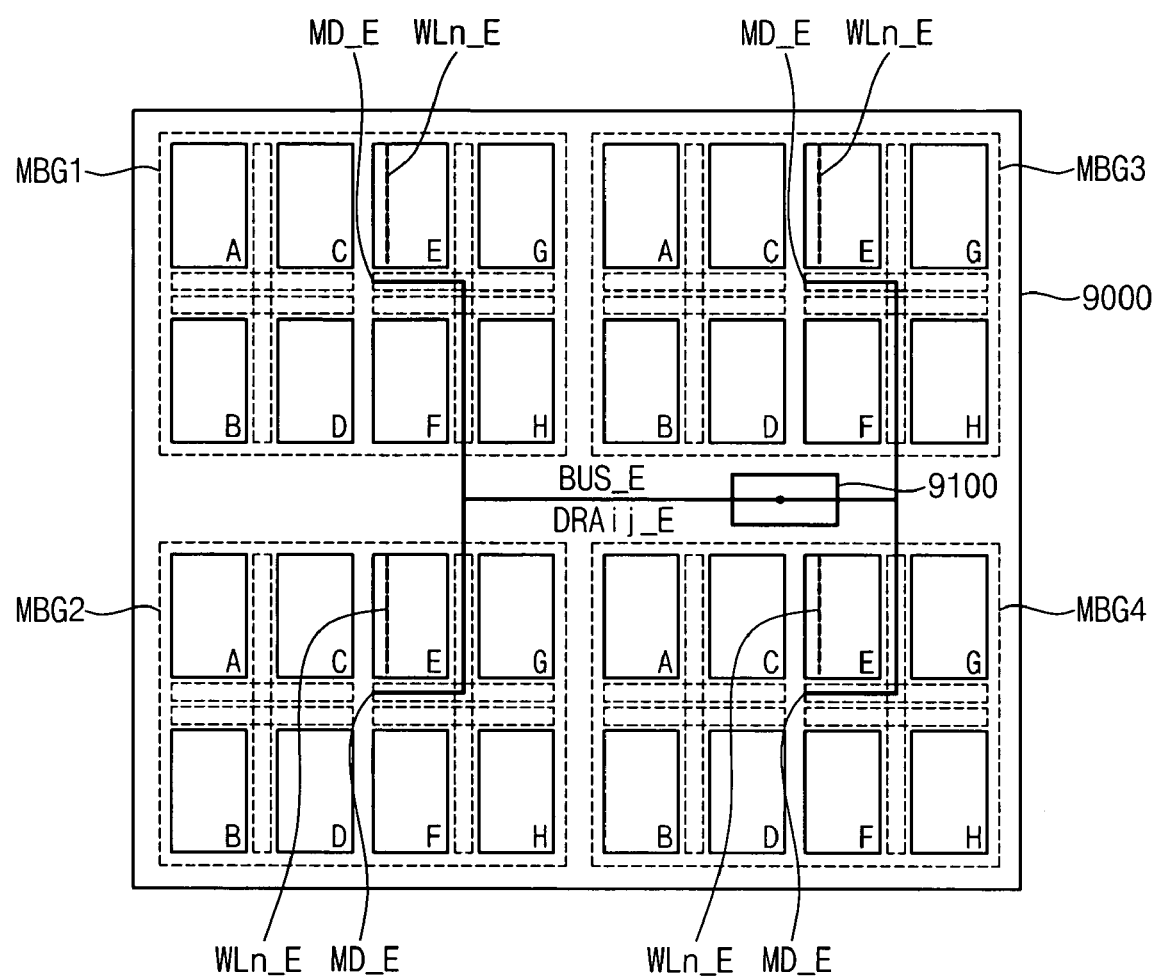
Figure 9F:
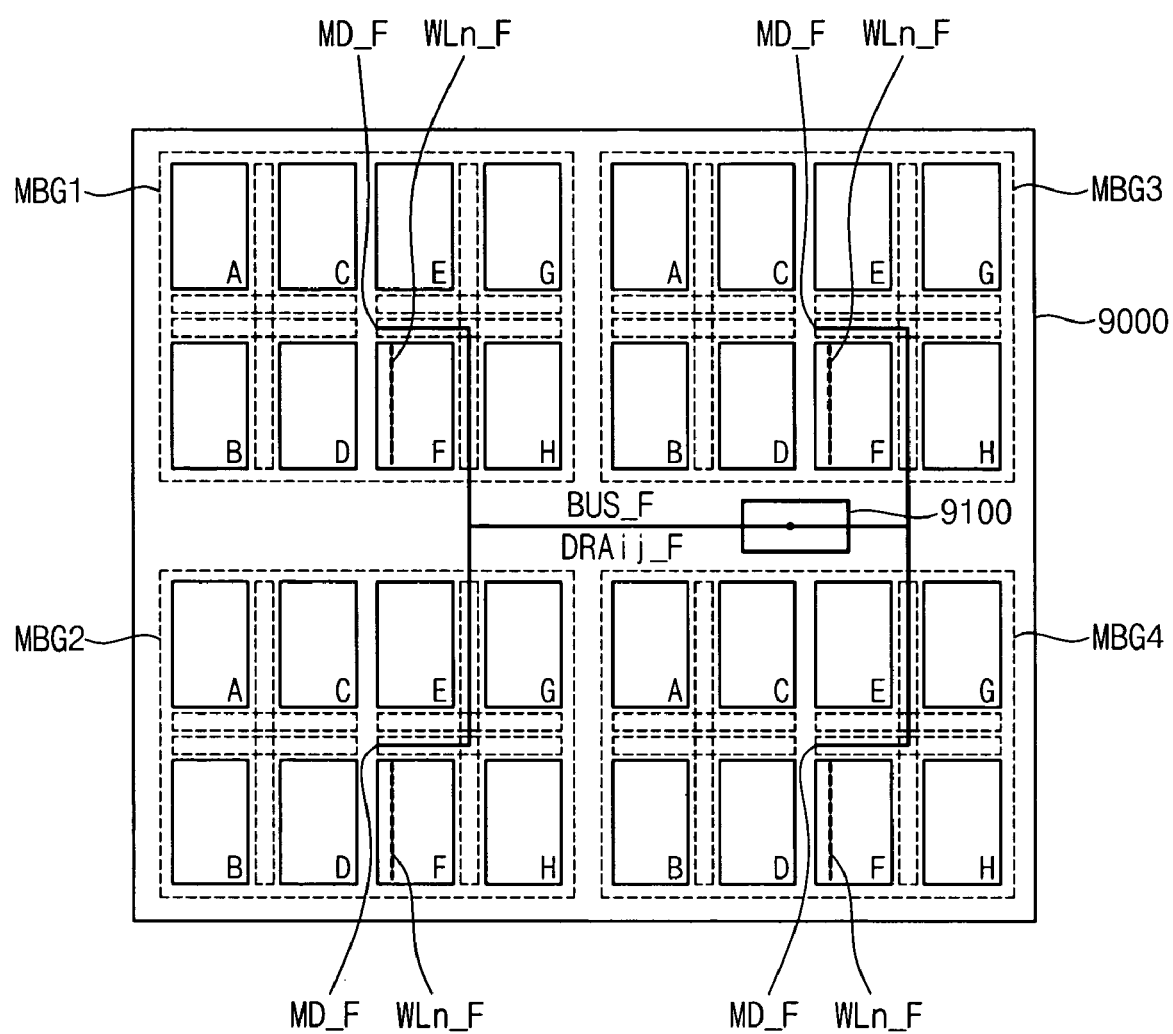
Figure 9G:
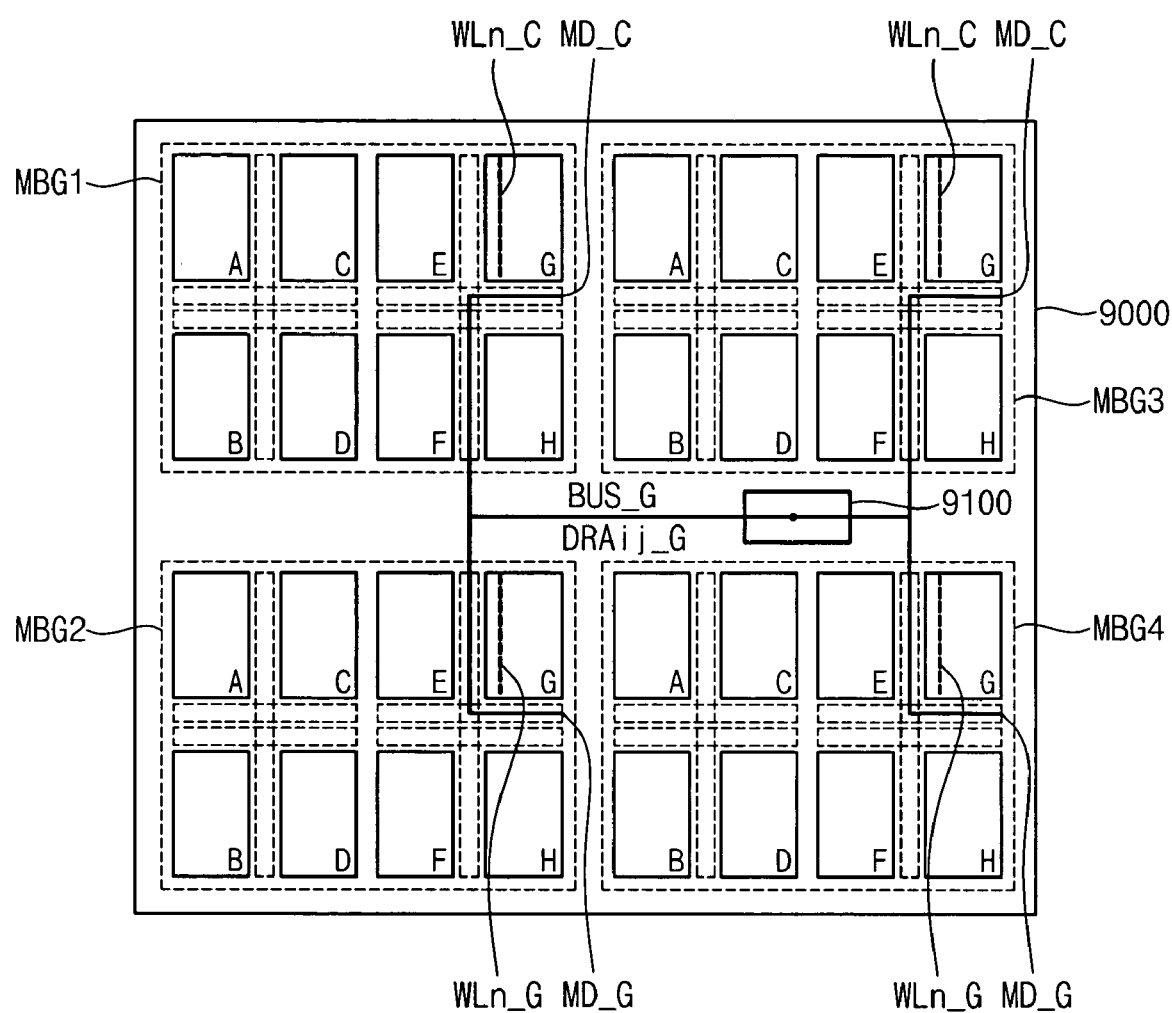
Figure 9H:
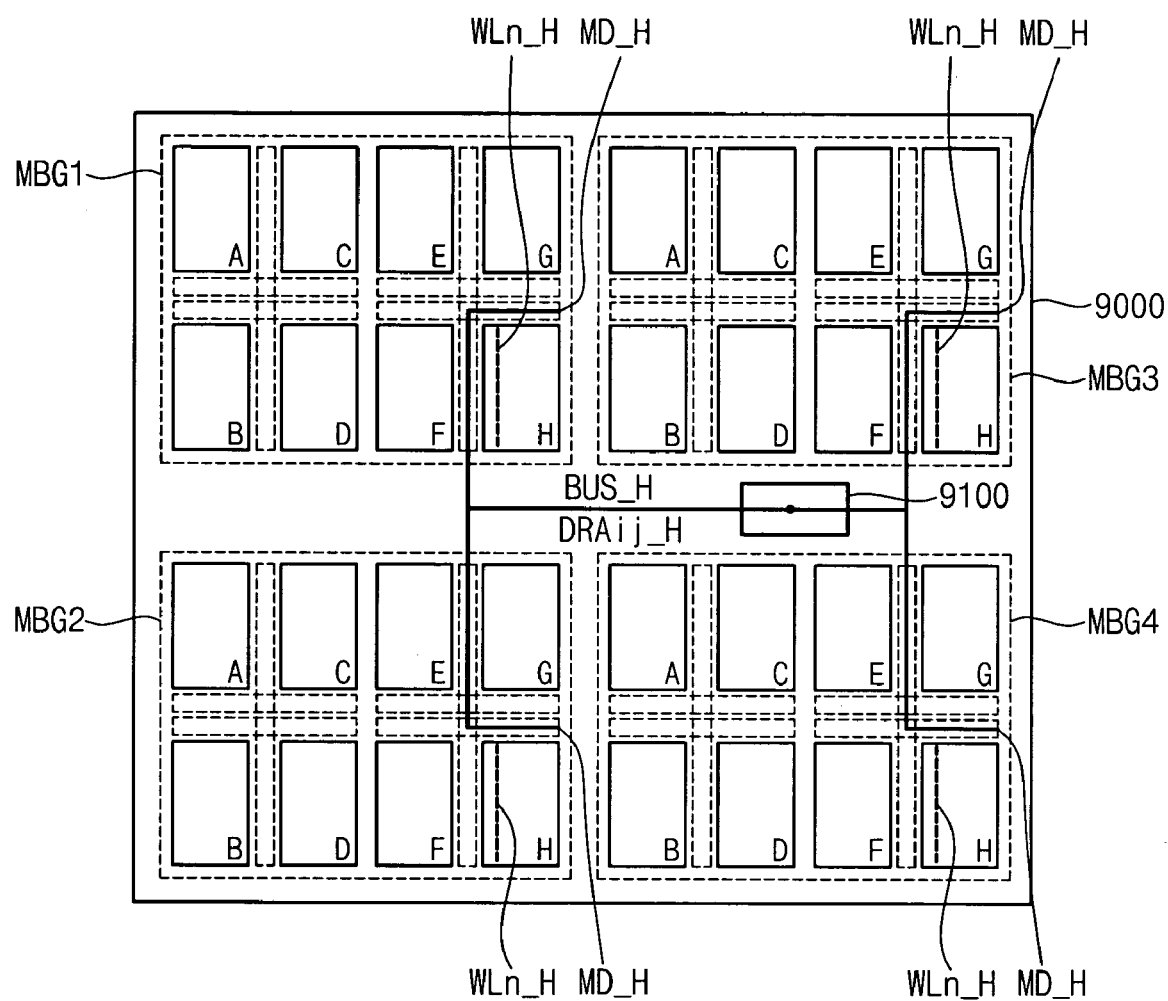

In FIG. 9A to FIG. 9H, the main decoders MD_A, MD_B, MD_C, MD_D, MD_E, MD_F, MD_G and MD_H are shown outside of each of the memory banks A, B, C, D, E, F, G and H, for convenience of description. FIG. 9A illustrates the activated signal bus BUS_A when the bank A is accessed. FIG. 9B illustrates the activated signal bus BUS_B when the bank B is accessed. FIG. 9C illustrates the activated signal bus BUS_C when the bank C is accessed. FIG. 9D illustrates the activated signal bus BUS_D when the bank D is accessed. FIG. 9E illustrates the activated signal bus BUS_E when the bank E is accessed. FIG. 9F illustrates the activated signal bus BUS_F when the bank F is accessed. FIG. 9G illustrates the activated signal bus BUS_G when the bank G is accessed. FIG. 9H illustrates the activated signal bus BUS_H when the bank H is accessed. Only activated signal buses are shown in FIG. 9A to FIG. 9H, for convenience of explanation; however, it will be understood that all the buses BUS_A, BUS_B, BUS_C, BUS_D, BUS_E, BUS_F, BUS_G, and BUS_H exist in the semiconductor memory chip 9000.

Referring to FIG. 9A, when the bank A is accessed, a decoded row address signal DRAij_A, the output of the decoder unit 9100, is transferred to the memory banks denoted as 'A' through the activated signal bus BUS_A. Main decoders denoted as MD_A and the word line driving circuits (not shown) generate the word line driving signal WLn_A to drive word lines corresponding to the word line driving signal WLn_A in response to the decoded row address signal DRAij_A.

Referring to FIG. 9B, when the bank B is accessed, a decoded row address signal DRAij_B, the output of the decoder unit 9100, is transferred to the memory banks denoted as 'B' through the activated signal bus BUS_B. Main decoders denoted as MD_B and the word line driving circuits (not shown) generate the word line driving signal WLn_B to drive word lines corresponding to the word line driving signal WLn_B in response to the decoded row address signal DRAij_B.

Referring to FIG. 9C, when the bank C is accessed, a decoded row address signal DRAij_C, the output of the decoder unit 9100, is transferred to the memory banks denoted as 'C' through the activated signal bus BUS_C. Main decoders denoted as MD_C and the word line driving circuits (not shown) generate the word line driving signal WLn_C to drive word lines corresponding to the word line driving signal WLn_C in response to the decoded row address signal DRAij_C.

Referring to FIG. 9D, when the bank D is accessed, a decoded row address signal DRAij_D, the output of the decoder unit 9100, is transferred to the memory banks denoted as 'D' through the activated signal bus BUS_D. Main decoders denoted as MD_D and the word line driving circuits (not shown) generate the word line driving signal WLn_D to drive word lines corresponding to the word line driving signal WLn_D in response to the decoded row address signal DRAij_D.

Referring to FIG. 9E, when the bank E is accessed, a decoded row address signal DRAij_E, the output of the decoder unit 9100, is transferred to the memory banks denoted as 'E' through the activated signal bus BUS_E. Main decoders denoted as MD_E and the word line driving circuits (not shown) generate the word line driving signal WLn_E to drive word lines corresponding to the word line driving signal WLn_E in response to the decoded row address signal DRAij_E.

Referring to FIG. 9F, when the bank F is accessed, a decoded row address signal DRAij_F, the output of the decoder unit 9100, is transferred to the memory banks denoted as 'F' through the activated signal bus BUS_F. Main decoders denoted as MD_F and the word line driving circuits (not shown) generate the word line driving signal WLn_F to drive word lines corresponding to the word line driving signal WLn_F in response to the decoded row address signal DRAij_F.

Referring to FIG. 9G, when the bank G is accessed, a decoded row address signal DRAij_G, the output of the decoder unit 9100, is transferred to the memory banks denoted as 'G' through the activated signal bus BUS_G. Main decoders denoted as MD_G and the word line driving circuits (not shown) generate the word line driving signal WLn_G to drive word lines corresponding to the word line driving signal WLn_G in response to the decoded row address signal DRAij_G.

Referring to FIG. 9H, when the bank H is accessed, a decoded row address signal DRAij_H, the output of the decoder unit 9100, is transferred to the memory banks denoted as 'H' through the activated signal bus BUS_H. Main decoders denoted as MD_H and the word line driving circuits (not shown) generate the word line driving signal WLn_H to drive word lines corresponding to the word line driving signal WLn_H in response to the decoded row address signal DRAij_H.

As can be seen in FIG. 9A to FIG. 9H, the lengths of the paths from the decoder unit 9100 to the banks A, B, C, D, E, F, G, or H that operate in response to the corresponding address signals DRAij_A, DRAij_B, DRAij_C, DRAij_D, DRAij_E, DRAij_F, DRAij_G, or DRAij_H, respectively, are substantially the same. Therefore, the mismatch over the signal transmission among memory bank groups can be decreased. Further, the possibility of malfunction of semiconductor memory devices can be decreased and the immunity to noise can be increased because signal skew among the memory bank groups is small.

As described above, the semiconductor memory device having a stacked-bank architecture according to embodiments of the present invention enables decoded row address signals and activates word lines coupled to memory cells selectively with respect to the memory banks. Therefore, the gate loading and the line loading of the semiconductor memory device can be decreased and power consumption of the semiconductor memory device can be reduced. In addition, the semiconductor memory device having a stacked-bank architecture according to the present invention has minimized signal skew and can operate stably because the lengths of signal paths from the decoder unit to each of the memory banks in each of the memory bank groups are substantially the same.

Although the processes and apparatus of the present invention have been described in detail with reference to the accompanying drawings for the purpose of illustration, it is to be understood that the inventive processes and apparatus are not to be construed as limited thereby. It will be readily apparent to those of reasonable skill in the art that various modifications to the foregoing exemplary embodiments may be made without departing from the scope of the invention as defined by appended claims.

What is claimed is:

1. A semiconductor memory device, comprising:
   a plurality of memory bank groups, wherein each group includes a plurality of memory banks arranged in a stacked-bank architecture;
   a pre-decoder unit comprising a plurality of pre-decoders configured to decode a row address signal to generate a pre-decoded row address signal corresponding individually to each of the memory banks associated with the pre-decoded row address signal; and
   an output buffer unit comprising a plurality of output buffers, each configured to enable the pre-decoded row address signal in response to a corresponding one of a plurality of enable signals to enable a decoded row address signal,
   wherein each of the memory banks comprises a main decoder unit configured to generate a word line enable signal and a word line boosting signal in response to the decoded row address signal to individually select one of the memory banks associated with the decoded row address signal.

2. The semiconductor memory device of claim 1, further comprising:
   an address buffer configured to receive and latch an external address signal to generate the row address signal, the row address signal corresponding to the external address signal.

3. The semiconductor memory device of claim 1, wherein each of the memory banks further comprises:
   a memory cell array; and
   a word line driving unit configured to activate a word line of the memory cell array selectively with respect to the memory banks in response to the word line enable signal and the word line boosting signal.

4. The semiconductor memory device of claim 3, wherein memory banks in each memory bank group are arranged in two rows.

5. The semiconductor memory device of claim 4, wherein the main decoder unit is located between a memory bank in a first row and a memory bank in a second row.

6. The semiconductor memory device of claim 4, wherein the lengths of signal paths from the pre-decoder unit to each memory bank are substantially the same.

7. The semiconductor memory device of claim 1, wherein the pre-decoder unit is configured to be arranged among the memory bank groups.

8. The semiconductor memory device of claim 1, wherein the enable signals are configured to be generated selectively with respect to the memory banks in response to a row address strobe signal and a bank address signal.

9. The semiconductor memory device of claim 8, wherein the enable signals are configured to be generated selectively with respect to the memory banks in response to the bank address signal, and configured to be activated by the row address strobe signal.

10. The semiconductor memory device of claim 9 further comprising an enable signal generating circuit for generating the enable signals.

11. The semiconductor memory device of claim 10, wherein the enable signal generating circuit comprises:
    a bank selection signal generating circuit configured to generate bank selection signals having a pulse form that is selective with respect to the memory banks; and
    a pulse-width modulating unit configured to modulate a pulse width of the bank selection signals to generate the enable signals.

12. The semiconductor memory device of claim 11, wherein the pulse-width modulating unit comprises pulse-width modulating circuits configured to modulate the pulse width of each of the bank selection signals to generate each of the enable signals, the enable signals being selective with respect to the memory banks.

13. The semiconductor memory device of claim 12, wherein each of the pulse-width modulating circuits comprises:
    a delay circuit configured to delay a bank selection signal for a predetermined time; and an OR gate configured to execute a logical "OR"0 operation to generate one of the enable signals.

14. A semiconductor memory device, comprising:
first to M memory bank groups, wherein each group includes first to N memory banks arranged in a stacked-bank architecture;
a pre-decoder unit comprising a plurality of pre-decoders configured to decode a row address signal to generate a pre-decoded row address signal corresponding individually to each of the first to N memory banks associated with the pre-decoded row address signal; and
an output buffer unit comprising a plurality of output buffers configured to enable the pre-decoded row address signal in response to a corresponding one of a plurality of enable signals to enable a decoded row address signal,
wherein each of the memory banks comprises a main decoder unit configured to generate a word line enable signal and a word line boosting signal in response to the decoded row address signal to individually select one of the memory banks associated with the decoded row address signal.

15. The semiconductor memory device of claim 14, wherein each of the first to N memory banks is configured to be driven by the corresponding decoded row address signal, respectively.

16. The semiconductor memory device of claim 14, wherein word lines that belong to one bank among the amount of N memory banks are activated in one read cycle or in one write cycle.

17. The semiconductor memory device of claim 14, wherein the pre-decoder unit is configured to be arranged among the memory bank groups.

18. The semiconductor memory device of claim 14, wherein a value of M is 4.

19. The semiconductor memory device of claim 18, wherein a value of N is 4.

20. The semiconductor memory device of claim 18, wherein a value of N is 8.

21. A method of driving word lines of a semiconductor memory device, comprising:
decoding a row address signal to generate a pre-decoded row address signal corresponding individually to each of a plurality of memory banks associated with the pre-decoded row address signal;
enabling the pre-decoded row address in response to a corresponding one of a plurality of enable signals to enable a decoded row address signal;
generating a word line enable signal and a word line boosting signal in response to the decoded row address signal to individually select one of the memory banks associated with the decoded row address signal; and
activating a word line of a memory cell array selectively with respect to the memory banks in response to the word line enable signal and the word line boosting signal.

22. The method of driving word lines of a semiconductor memory device of claim 21, further comprising:
latching an external address signal to generate the row address signal, the row address signal corresponding to the external address signal.

* * * * *